United States Patent
Wu

(10) Patent No.: US 8,503,263 B2
(45) Date of Patent: Aug. 6, 2013

(54) MEMORY MODULE AND POWER SUPPLY SYSTEM

(75) Inventor: Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 155 days.

(21) Appl. No.: 13/241,078

(22) Filed: Sep. 22, 2011

(65) Prior Publication Data

US 2013/0021865 A1    Jan. 24, 2013

(51) Int. Cl.
*G11C 5/14* (2006.01)
*G11C 7/00* (2006.01)
*H02H 7/00* (2006.01)
*G03G 15/02* (2006.01)

(52) U.S. Cl.
USPC .......... 365/226; 365/189.09; 365/189.11; 361/18; 361/235

(58) Field of Classification Search
USPC ............... 365/226, 189.09, 189.11; 361/18, 361/235
See application file for complete search history.

(56) References Cited

U.S. PATENT DOCUMENTS

| | | |
|---|---|---|
| 2005/0021895 A1* | 1/2005 | Son et al. ............. 710/301 |
| 2007/0295818 A1* | 12/2007 | Li et al. ............. 235/472.01 |
| 2010/0142247 A1* | 6/2010 | Schuette et al. ............. 365/51 |
| 2012/0110363 A1* | 5/2012 | Bacchus et al. ............. 713/340 |

* cited by examiner

*Primary Examiner* — Ly D Pham
(74) *Attorney, Agent, or Firm* — Altis Law Group, Inc.

(57) ABSTRACT

A memory module includes a ground terminal, a power terminal, a voltage regulator down, and a storing unit. The power terminal and the ground terminal are connected to a power source that supplies a first direct voltage. The voltage regulator down is connected to the power terminal and configured for converting the first direct current voltage to a second direct current voltage. The storing unit is connected the voltage regulator down for storing data and reading or writing data when the storing unit receives the second direct current voltage.

4 Claims, 2 Drawing Sheets

MEMORY MODULE AND POWER SUPPLY SYSTEM

BACKGROUND

1. Technical Field

The present disclosure relates to memory modules and, particularly, to a memory module and a power supply system using the memory module.

2. Description of Related Art

Motherboards usually include a number of memory adaptors and a voltage regulator down (VRD). Each memory adaptor is adapted for receiving a memory module. The VRD converts external voltage into a working voltage of the memory module and supplies the working voltage to each memory adaptor. The output power of the VRD is usually set/designed to be equal to or slightly higher than a total power consumption of the memory modules when all the memory adaptors receive respective memory modules. However, the power efficiency of the VRD is low when not all the memory adaptors are used.

Therefore, it is desirable to provide a disclosure, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
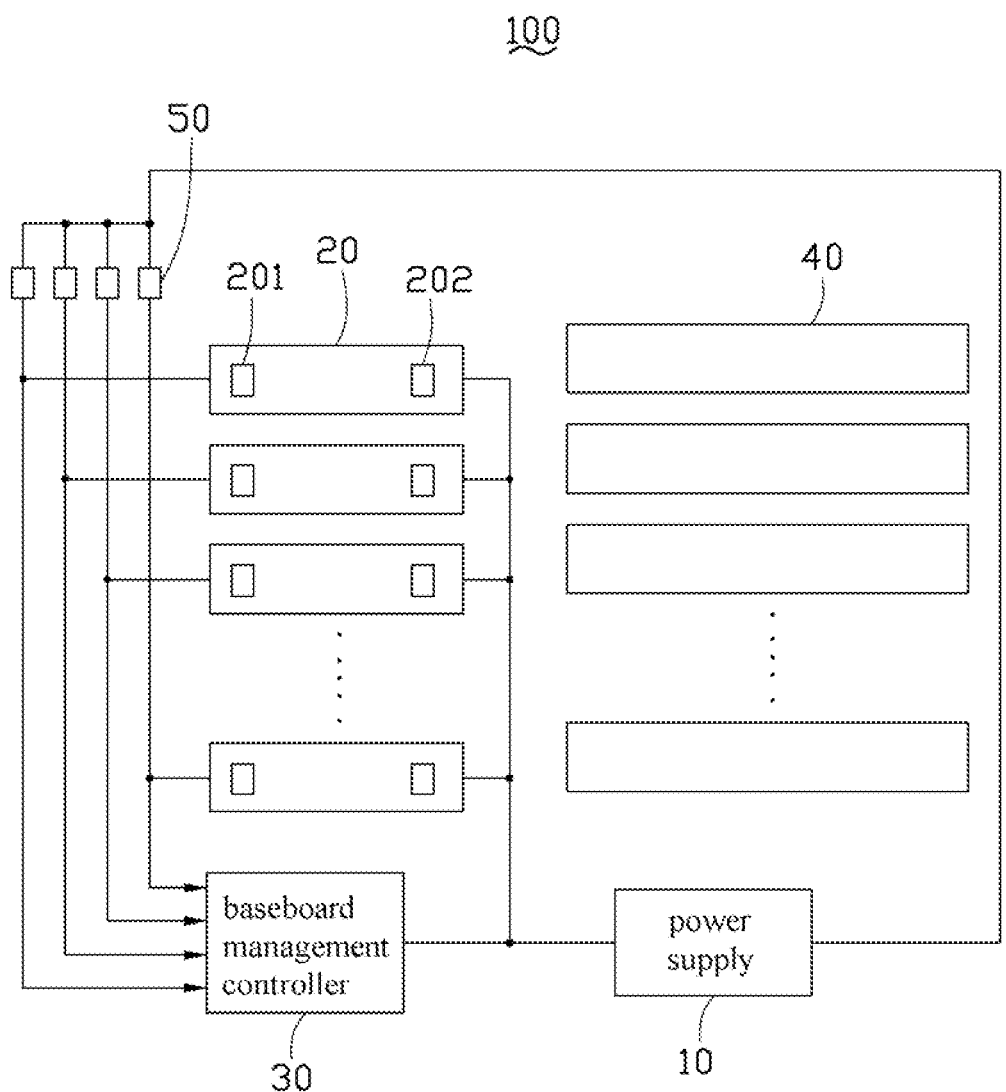
FIG. 1 is a functional block diagram of a power supply system, according to an exemplary embodiment.
Figure 2:
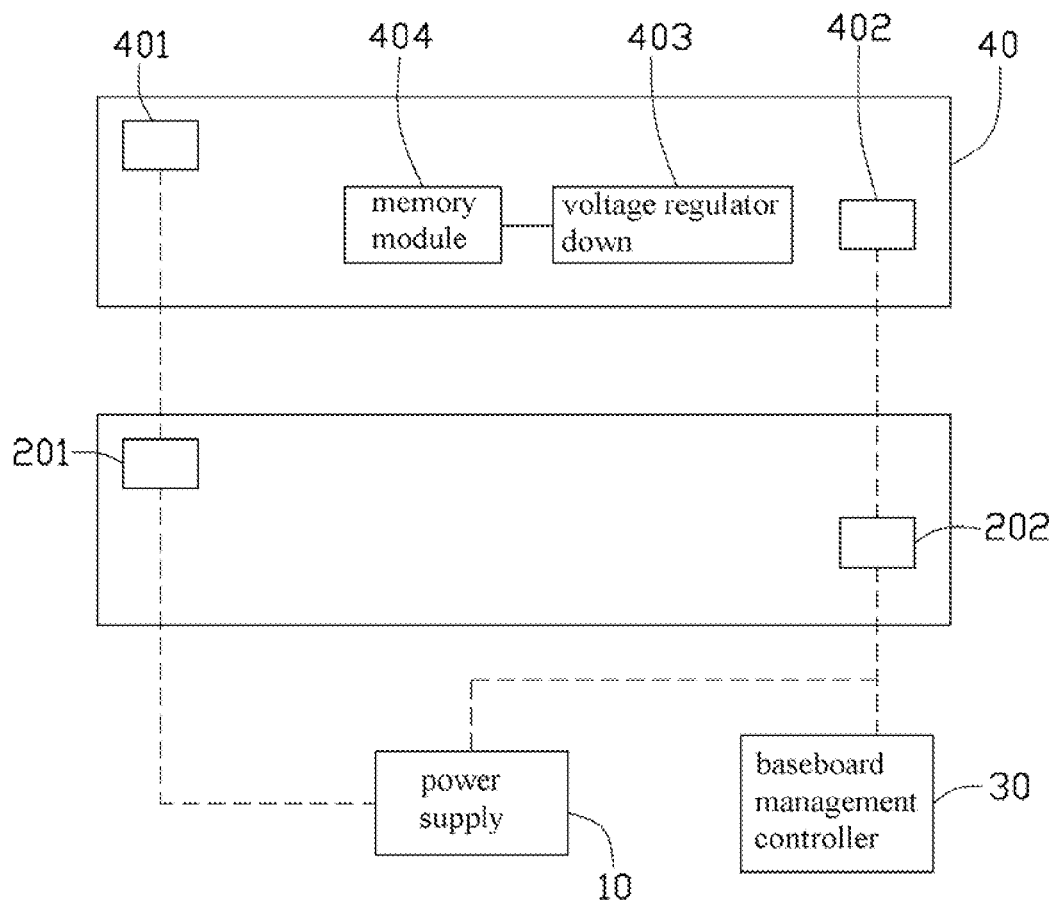
FIG. 2 is a partial functional block diagram of the power supply system of FIG. 1

Referring to FIGS. 1 and 2, a power supply system 100, according to an exemplary embodiment, includes a power supply 10, a plurality of memory adaptors 20, a baseboard management controller (BMC) 30, a plurality of memory modules 40, and a plurality of pull-up resistors 50.

The power supply 10 supplies a first direct current (DC) voltage to each of memory adaptors 20. In one embodiment, the first DC voltage can be about 12 volts.

Each memory adaptor 20 is adapted for receiving a memory module 40. Each memory adaptor 20 includes a first ground terminal 201 and a first power terminal 202. Each first ground terminal 201 is connected to the power source 10 via a corresponding pull-up resistor 50. Each first ground terminal 201 is further connected to the BMC 30. Each first ground terminal 201 outputs loading signals to the BMC 30. The loading signals are configured for notifying the BMC 30 if a memory module 40 is received in a corresponding adaptor 20. When a memory module 40 is received in a corresponding memory adaptor 20, the first ground terminal 201 of the corresponding memory adaptor 20 outputs a low voltage level (for example, a low voltage level of 0 volts) to the BMC 30. Inversely, when the memory module 40 is not received in the corresponding memory adaptor 20, the first ground terminal 201 of the corresponding memory adaptor 20 outputs a high voltage level (for example, a high voltage level of about 12 volts) to the BMC 30. Each first power terminal 202 is electrically connected to the power supply 10.

The BMC 30 includes an input terminal and an output terminal. The input terminal of the BMC 30 is connected to each first ground terminal 201. The output terminal of the BMC 30 is electrically connected to each first power terminal 202. The BMC 30 detects if a memory module 40 is received in a corresponding memory adaptor 20 according to the loading signals.

Each memory module 40 is designed with a power rating and a voltage rating. In one embodiment, the power rating can be about 10 watts and the voltage rating can be about 1.5 volts. Each memory module 40 includes a second ground terminal 401, a second power terminal 402, a VRD 403, and a storing unit 404. Each second ground terminal 401 corresponds to each first ground terminal 201. Each second power terminal 402 corresponds to each first power terminal 202. Each VRD 403 is connected to the second power terminal 402. Each VRD 403 is configured for converting the first DC voltage into a second DC voltage and outputting the second DC voltage to the storing unit 404. In this embodiment, the second DC voltage is substantially equal to the voltage rating. Each storing unit 404 is connected to the VRD 403, stores data and reads or writes data when the each storing unit 404 receives the second DC voltage. In this embodiment, the memory modules 40 are dual in-line memory modules (DIMM).

In use, when one of the memory modules 40 is received in a corresponding memory adaptor 20, the second ground terminal 401 and the second power terminal 402 are respectively connected to a corresponding first ground terminal 201 and first power terminal 202. The first ground terminal 201 connects with the second ground terminal 401 and outputs a loading signal of a low voltage level (for example, a low voltage level of 0 volts) to the BMC 30. The BMC 30 receives the loading signal of the low voltage level and obtains the power rating of the memory module 40 received in the corresponding memory adaptor 20 through a base input/output system (BIOS). The BMC 30 sends a control signal to the VRD 403 of the memory module 40 received in the corresponding memory adaptor 20 and controls an output power of the VRD 403 to be substantially equal to the power rating. The VRD 403 converts the first DC voltage into the second DC voltage and outputs the second DC voltage to the corresponding storing unit 404. The output power of the VRD 403 is substantially equal to the power rating of the memory module 40 received in the corresponding memory adaptor 20. Such that the VRD 403 works at a fully load state. Power converting efficiency of the VRD 403 is high.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A power supply system, comprising:
a power supply supplying a first direct current voltage;
a plurality of memory adaptor, each memory adaptor comprising a first ground terminal and a first power terminal, the first ground terminal and the first power terminal connected to the power supply;
at least one memory module received in one of the memory adaptors, the at least one memory module comprising:
a second ground terminal;

a second power terminal, the second ground terminal and the second power terminal respectively connected to the first ground terminal and the first power terminal;

a voltage regulator down connected to the power terminal and configured for converting the first direct current voltage into a second direct current voltage; and a storing unit connected the voltage regulator down and configured for storing data and reading or writing data when the storing unit receives the second direct current voltage, wherein the power supply system further comprises a plurality of pull-up resistors, each of the first ground terminal is connected to the power source via a corresponding pull-up resistor and configured for outputting loading signals; the first ground terminal of the corresponding memory adaptor outputs a low voltage level when the at least one memory module is received in a corresponding memory adaptor.

2. The power supply system of claim 1, wherein the power supply system further comprises a baseboard management controller, the baseboard management comprises an input terminal and an output terminal; the input terminal of the baseboard management controller connected to each of the first ground terminal, the output terminal connected to each of the first power terminal, the baseboard management controller configured for detecting if the at least one memory module is received in the corresponding memory adaptor according to the loading signals.

3. The power supply system of claim 2, wherein the second direct current voltage is substantially equal to a voltage rating of the at least one memory module, the baseboard management controller is configured for obtaining a power rating of the at least one memory module and controlling an output power of the voltage regulator down to be substantially equal to the power rating.

4. The power supply system of claim 1, wherein the first direct voltage is about 12 volts and the second direct voltage is about 1.5 volts.

* * * * *